US009960484B2

(12) United States Patent
Chieh et al.

(10) Patent No.: US 9,960,484 B2
(45) Date of Patent: May 1, 2018

(54) NON-FOSTER ACTIVE IMPEDANCE CIRCUIT FOR ELECTRICALLY SMALL ANTENNAS

(71) Applicant: The United States of America as represented by the Secretary of the Navy, Washington, DC (US)

(72) Inventors: Jia-Chi Samuel Chieh, San Diego, CA (US); Lu Xu, San Diego, CA (US); Albert Ryu, Fremont, CA (US); John D. Rockway, San Diego, CA (US); Diana Arceo, San Diego, CA (US); Justin A. Church, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 302 days.

(21) Appl. No.: 14/793,547

(22) Filed: Jul. 7, 2015

(65) Prior Publication Data
US 2015/0318607 A1    Nov. 5, 2015

Related U.S. Application Data

(63) Continuation-in-part of application No. 13/494,111, filed on Jun. 12, 2012, now Pat. No. 9,112,258.

(51) Int. Cl.
*H01Q 1/24* (2006.01)
*H01Q 1/36* (2006.01)
*H03H 11/00* (2006.01)
*H01Q 7/00* (2006.01)
*H01Q 21/24* (2006.01)
*H01Q 5/35* (2015.01)

(52) U.S. Cl.
CPC ............. *H01Q 1/36* (2013.01); *H01Q 5/35* (2015.01); *H01Q 7/005* (2013.01); *H01Q 21/24* (2013.01); *H03H 11/00* (2013.01)

(58) Field of Classification Search
CPC ........... H01Q 1/243; H01Q 1/48; H01Q 5/50; H01Q 9/0407; H01Q 1/38; H01Q 15/002; H01Q 5/321; H01Q 7/005; H01Q 9/24; H01Q 5/25
USPC ............... 343/705, 749, 850, 860, 907, 702
See application file for complete search history.

(56) References Cited

U.S. PATENT DOCUMENTS 2,726,370 A    12/1955  Linvil
8,952,858 B2*  2/2015   de Rochemont ........ H01Q 9/26
                                                      343/795

(Continued)

OTHER PUBLICATIONS

Yifeng Fan et al. "Electrically Small Half-Loop Antenna Design with Non-Foster Matching Networks" IEEE Public on 2011.*

(Continued)

*Primary Examiner* — Linh Nguyen
(74) *Attorney, Agent, or Firm* — SPAWAR Systems Center Pacific; Kyle Eppele; J. Eric Anderson

(57) ABSTRACT

An antenna comprising: a driven element; an input feed coupled to the driven element wherein the input feed is configured to be connected to a receiver; a non-Foster circuit having a negative impedance, wherein the non-Foster circuit is configured to actively load the antenna at a location on the antenna other than at the input feed; and wherein the antenna fits within an imaginary sphere having a radius a, and wherein the product ka is less than 0.5, where k is a wave number.

18 Claims, 10 Drawing Sheets

(56) References Cited

U.S. PATENT DOCUMENTS

| | | | | |
|---|---|---|---|---|
| 9,172,147 | B1* | 10/2015 | Manry, Jr. | H01Q 1/286 |
| 9,214,724 | B2* | 12/2015 | White | H01Q 1/523 |
| 2002/0126049 | A1* | 9/2002 | Okabe | H01Q 1/243 |
| | | | | 343/700 MS |
| 2005/0280587 | A1* | 12/2005 | Svigelj | H01Q 1/243 |
| | | | | 343/702 |
| 2009/0140946 | A1 | 6/2009 | Ziolkowski et al. | |
| 2011/0165853 | A1* | 7/2011 | Robert | H01Q 9/02 |
| | | | | 455/269 |
| 2011/0273319 | A1* | 11/2011 | Mossallaei | H01Q 15/0086 |
| | | | | 342/1 |
| 2012/0256709 | A1* | 10/2012 | Hitko | H03F 1/56 |
| | | | | 333/216 |
| 2013/0009724 | A1 | 1/2013 | Xu et al. | |
| 2013/0201067 | A1* | 8/2013 | Hu | H01Q 1/243 |
| | | | | 343/745 |
| 2013/0214979 | A1* | 8/2013 | McMilin | H01Q 5/328 |
| | | | | 343/750 |
| 2014/0292586 | A1* | 10/2014 | Kato | H04B 5/0075 |
| | | | | 343/700 MS |
| 2015/0318612 | A1* | 11/2015 | Karlsson | H01Q 7/00 |
| | | | | 343/852 |
| 2016/0218416 | A1* | 7/2016 | Van Wonterghem | H01Q 21/28 |
| 2017/0162948 | A1* | 6/2017 | Wong | H01Q 5/10 |

OTHER PUBLICATIONS

"Electrically Small Half-Loop Antenna Design with Non-Foster Matching Networks" IEEE Public on 2011.*

"Metamaterial-Inspired Engineering of Antennas" by Richard W. Ziolkowski IEEE vol. 99, No. 10, Oct. 2011.*

Harold A. Wheeler; The Radiansphere Around a Small Antenna; Proceedings of the IRE, pp. 1325-1331; Aug. 1959.

Richard W. Ziolkowski et al.; Design and Experimental Verification of a 3D Magnetic EZ Antenna at 300 MHz; IEEE Antennas and Wireless Propagation Letters, vol. 8, 2009.

Justin Church et al.; UHF Electrically Small Box Cage Loop Antenna With an Embedded Non-Foster Load; IEE Antennas and Wireless Propagation Letters, vol. 13, Jul. 8, 2014.

White, C.R.; Colburn, J.S.; Nagele, R.G., "A Non-Foster VHF Monopole Antenna," Antennas and Wireless Propagation Letters, IEEE, vol. 11, No., pp. 584,587, 2012.

S. E. Sussman-Fort and R. M. Rudish "Non-Foster impedance matching of electrically-small antennas", IEEE Trans.Antennas Propag., vol. 57, No. 8, pp. 2230-2241 2009.

K. Song and R. G. Rojas "Non-Foster impedance matching of electrically small antennas", Proc. IEEEAntennas Propag. Int. Symp., pp. 1-4 2010.

C. R. White, J. W. May and J. S. Colburn "A variable negative-inductance integrated circuit at UHF frequencies", IEEEMicrow. Wireless Compon. Lett., vol. 22, No. 1, pp. 35-37 2012.

N. Zhu, and R. W. Ziolkowski, "Active Metamaterial-Inspired Broad-Bandwidth Efficient, Electrically Small Antennas," IEEE Antennas and Wireless Propagation Letters, vol. 10, 2011.

N. Zhu, and R. W. Ziolkowski, "Design and Measurements of an Electrically Small, Broad Bandwidth, Non-Foster Circuit-Augmented Protractor Antennas," Applied Physics Letters, vol. 101, 2012.

Ziolkowski et al.; Metamaterial-Inspired Engineering of Antennas; Proceedings of the IEEE | vol. 99, No. 10, Oct. 2011.

Stearns, Steve; Bode, Chu, Fano, Wheeler: Antenna Q and Match Bandwidth; ARRL Pacificon Antenna Seminar, Santa Clara, CA Oct. 11-13, 2013.

* cited by examiner

NON-FOSTER ACTIVE IMPEDANCE CIRCUIT FOR ELECTRICALLY SMALL ANTENNAS

CROSS-REFERENCE TO RELATED APPLICATION

This application is a continuation-in-part of prior U.S. application Ser. No. 13/494,111, filed 12 Jun. 2012, titled "Electrically Small Circularly Polarized Antenna" (Navy Case #101173), which application is hereby incorporated by reference herein in its entirety.

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102794.

BACKGROUND OF THE INVENTION

The invention disclosed herein relates to the field of Electrically Small Antennas (ESAs). The performance of ESAs are dictated by the Chu Limit, in which the gain-bandwidth product cannot exceed this fundamental limit. Efficient ESAs are limited in application because of their small bandwidth performance. Traditional passive impedance matching methods, when implemented at the input of an ESA, have been shown to improve this bandwidth performance, although as with any passive network are further limited by the Bode-Fano limit. There exists a need for an improved ESA, particularly for the VHF and UHF frequencies, as the operational wavelengths here are on the order of several meters. Conventional full size antennas at these frequencies are often impractical as their physical sizes are on the order of the wavelength. Efficient, broadband ESAs are sorely needed for applications at these frequencies, which are capable of meeting or exceeding the gain-bandwidth performance dictated by the Chu Limit.

SUMMARY

Described here is an antenna comprising: a driven element, an input feed, and a non-Foster circuit. The input feed is coupled to the driven element and is configured to be connected to a receiver. The non-Foster circuit has a negative impedance and is configured to actively load the antenna at a location on the antenna other than at the input feed. The antenna may be contained within an imaginary sphere having a radius a, and wherein the product ka is less than 0.5, where k is a wave number.

The antenna described herein may be provided by following the following steps. The first step includes providing a driven element having an input feed. The next step provides for actively loading the antenna with a Non-Foster circuit at a location on the antenna that is not at the input feed.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
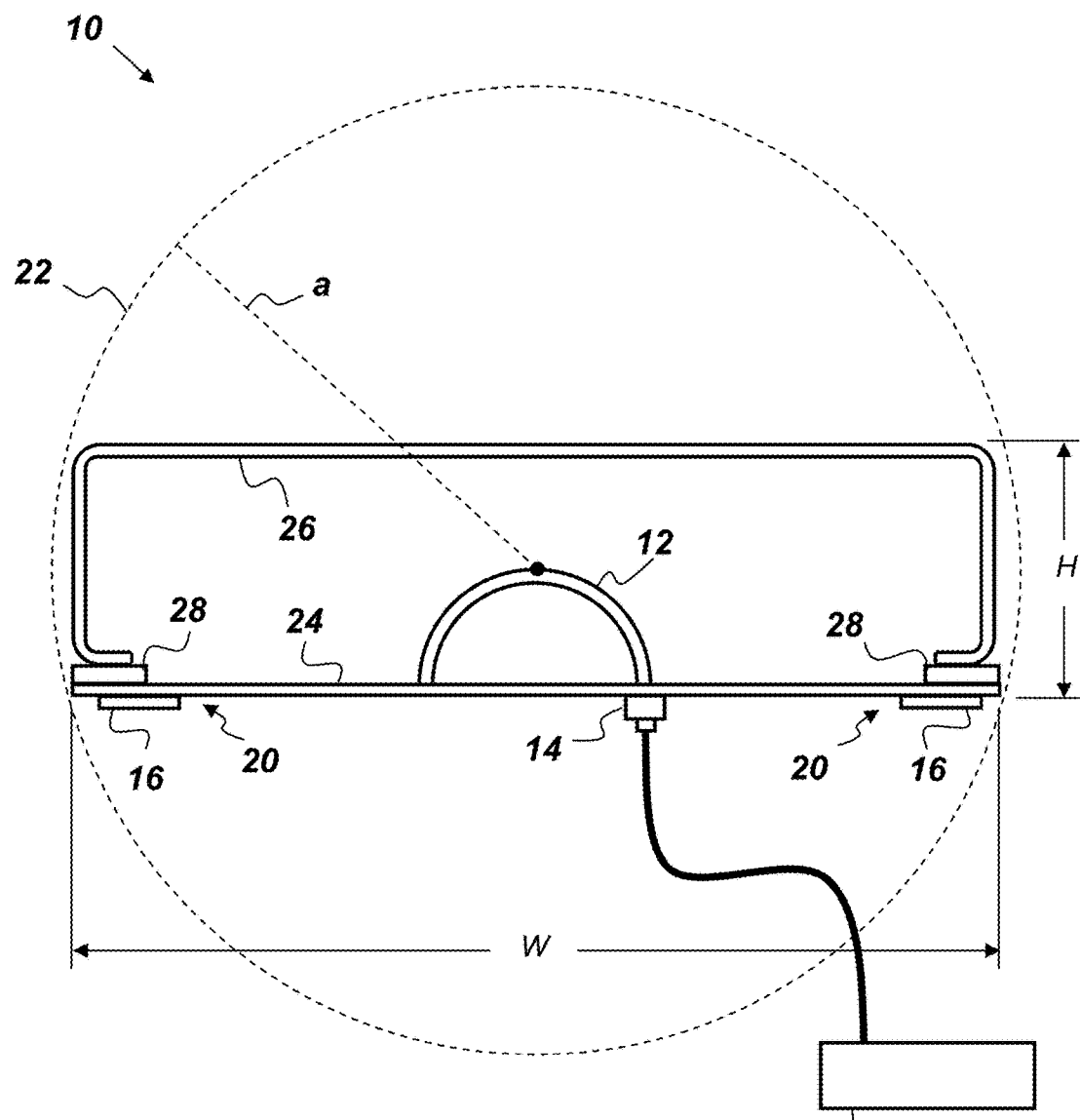
FIG. 1 is a side-view illustration of an embodiment of an electrically small antenna.

FIG. 1 is a side-view illustration of an electrically small antenna (ESA) 10 that comprises, consists of, or consists essentially of a driven element 12, an input feed 14, and a non-Foster circuit 16. The driven element 12 may be coupled to the input feed 14 and the input feed 14 may be configured to be connected to a receiver 18. The non-Foster circuit 16 has a negative impedance and may be configured to actively load the ESA 10 at a location 20 on the antenna 10 other than at the input feed 14. The locations 20 can be any location/locations on the ESA 10 that is/are not the input feed 14. In the embodiment of the ESA 10 shown in FIG. 1, the non-Foster circuit 16 actively loads the ESA 10 at two locations 20. The ESA 10 is electrically small, which means that the antenna 10 may be contained within an imaginary sphere 22 having a radius a such that the product ka is less than 0.5, where k is a wave number. The embodiment of the ESA 10 shown in FIG. 1 comprises a ground plane 24, a conductive, three-sided cage 26, and dielectric spacers 28, which serve to electrically isolate the cage 26 from the ground plane 24.

An antenna is considered an ESA when the product ka is less than 0.5. The Chu-Wheeler limit states that the quality factor (Q) of an antenna increases as the antenna is made physically smaller. In addition, it can be shown that Q of an antenna is inversely proportional to the antenna's operational bandwidth. The Chu limit applies to the instantaneous bandwidth available for signals passing through the antenna and sets a minimum size for any antenna used at a given frequency and with a given required bandwidth. Non-Foster circuit matching techniques may be used to overcome the Chu limit. Traditional passive impedance matching methods are limited by the Bode-Fano limit, but non-Foster matching allows for the possibility of implementing negative reactances that are not bound by this limit. Since the non-Foster circuitry requires the use of active circuit components, implementing non-Foster circuits within ESAs is non-trivial since active circuits are prone to being excited in unstable states that can lead to unbounded current oscillations within the circuit. Time domain simulations such as are provided by Agilent® ADS may be performed to ensure that a given non-Foster circuit design is stable within a desired frequency band.

The driven element 12 may be any conductive element capable of being driven by incoming electromagnetic radiation such as in a receiving antenna. The driven element 12 may be made of any conductive material and have any desired size and shape. A suitable example embodiment of the driven element 12 is, but is not limited to, a conductive half loop such that a ground plane 24 induces the "image" of the other half of the loop and hence, the combination acts as a whole loop electrically.

The input feed 14 serves as the connection point for the receiver 18 to connect to the ESA 10. A suitable example embodiment of the input feed 14 comprises a coaxial connector, typically an Small Male Adapter (SMA), to which the center pin of the SMA is soldered directly to the driven element 12, such as the half loop depicted in FIG. 1, in which case the opposing end of the half loop may be either soldered directly to the ground plane 24 or may optionally be soldered to a first terminal of a capacitor in which a second terminal of the capacitor is connected to the ground plane 24. Such an optional capacitor here allows for additional tuning of the center resonant frequency of the ESA 10.

The non-Foster circuit 16 may be any circuit with a non-Foster impedance such that there is a negative inductance (−L), a negative capacitance (−C), or a combination thereof. The non-Foster circuit 16 may be used to load the ESA 10 at a location other than at the input feed 14 of the ESA 10 to cancel the antenna's reactance. A non-Foster matching with only one component is limited in application. Passive impedance matching at the input of the antenna increases the impedance bandwidth but does not increase the radiation efficiency. The non-Foster circuit 16 may have a parallel combination of a negative capacitance (−C) and a negative inductance (−L). Efficient ESAs are only efficient at the frequencies they are well matched for and therefore also have a narrow efficiency bandwidth. Therefore, rather than implementing a non-Foster matching circuit at the input feed 14 of the ESA 10, the non-Foster matching circuit 16 may be used to load the ESA 10 at locations 20, such as are shown in FIG. 1, for both increased radiation efficiency and impedance matching.

Figure 2:
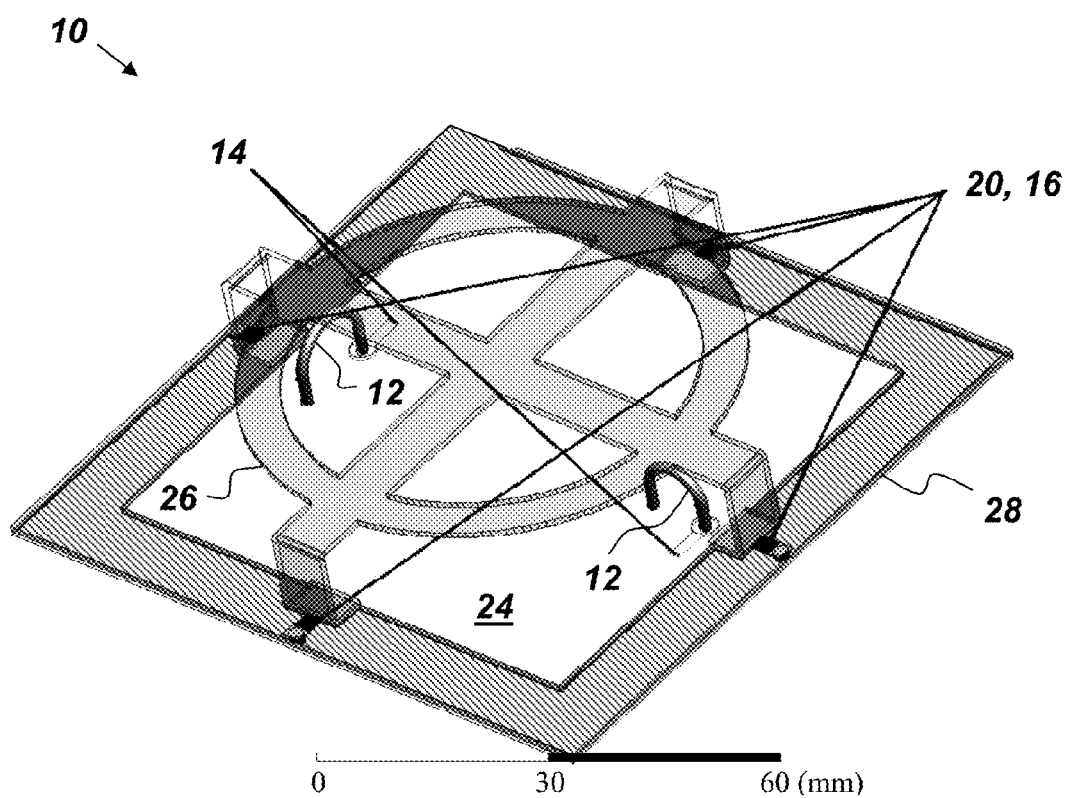
FIG. 2 is a perspective-view illustration of an embodiment of an electrically small antenna.

FIG. 2 is a perspective view of an embodiment of the ESA 10. This embodiment of the ESA 10 is circularly polarized version of the ESA 10 shown in FIG. 1 and has a ka of 0.39. The circular polarization arises from the orthogonal placement of driven elements 12, which in this embodiment are two half loops, which are driven by radio frequency (RF) signals which are 90 degrees out of phase. The impedance matching method is similar to that of the embodiment of the ESA 10 shown in FIG. 1, in that the inductive field generated by the two half loops is canceled by the capacitive field generated by a cage structure 26 that is electrically isolated from the ground plane 24 by a dielectric layer spacer 28. In this embodiment, the non-Foster circuit 16 actively loads the ESA 10 at four locations 20.

Figure 3:
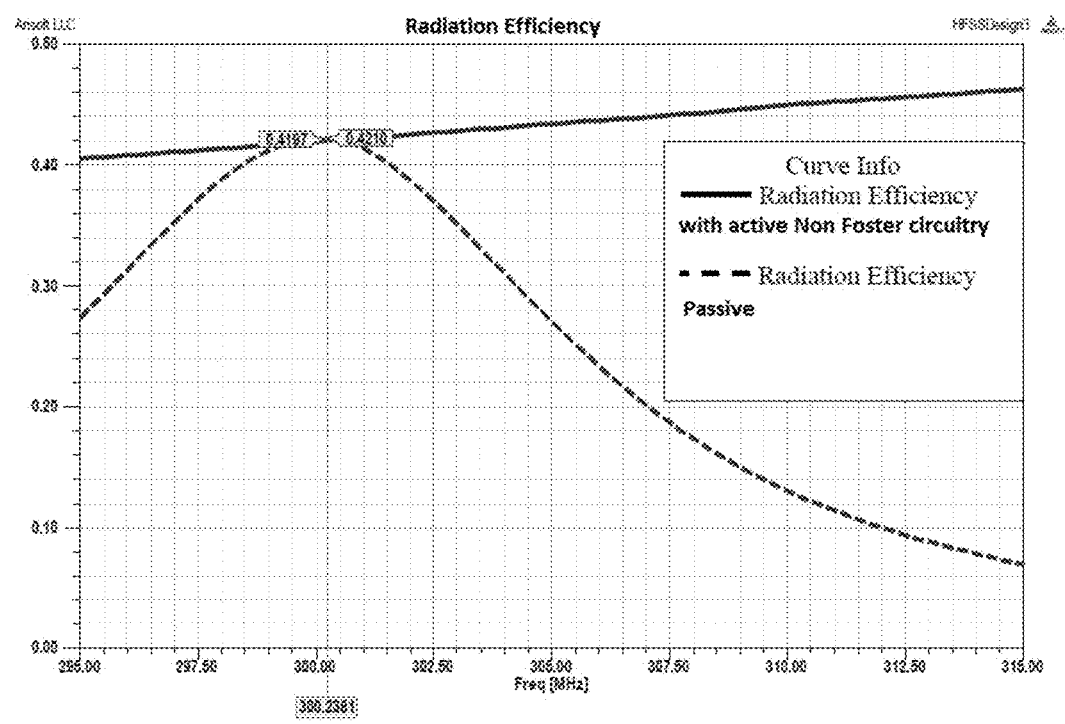
FIG. 3 is a plot of frequency versus radiation efficiency comparison of an antenna with and without integrated non-Foster circuitry.

FIG. 3 is a plot of frequency versus radiation efficiency for a passively-matched, traditional (i.e., without non-Foster matching) ESA and the ESA 10 that utilizes non-Foster matching. FIG. 3 illustrates the Ansys® HFSS simulation comparison of the radiation efficiency of passive and non-Foster matching circuitry when implemented in an embodiment of the ESA 10. The radiation efficiency of the ESA 10, which has negative impedance is represented by the solid trace. The radiation efficiency of the traditional ESA, which does not have negative impedance, is represented by the dotted trace. The traditional design is 40% efficient and is narrowband while the ideal negative impedance load increases the radiation efficiency bandwidth of the ESA 10.

Figure 4:
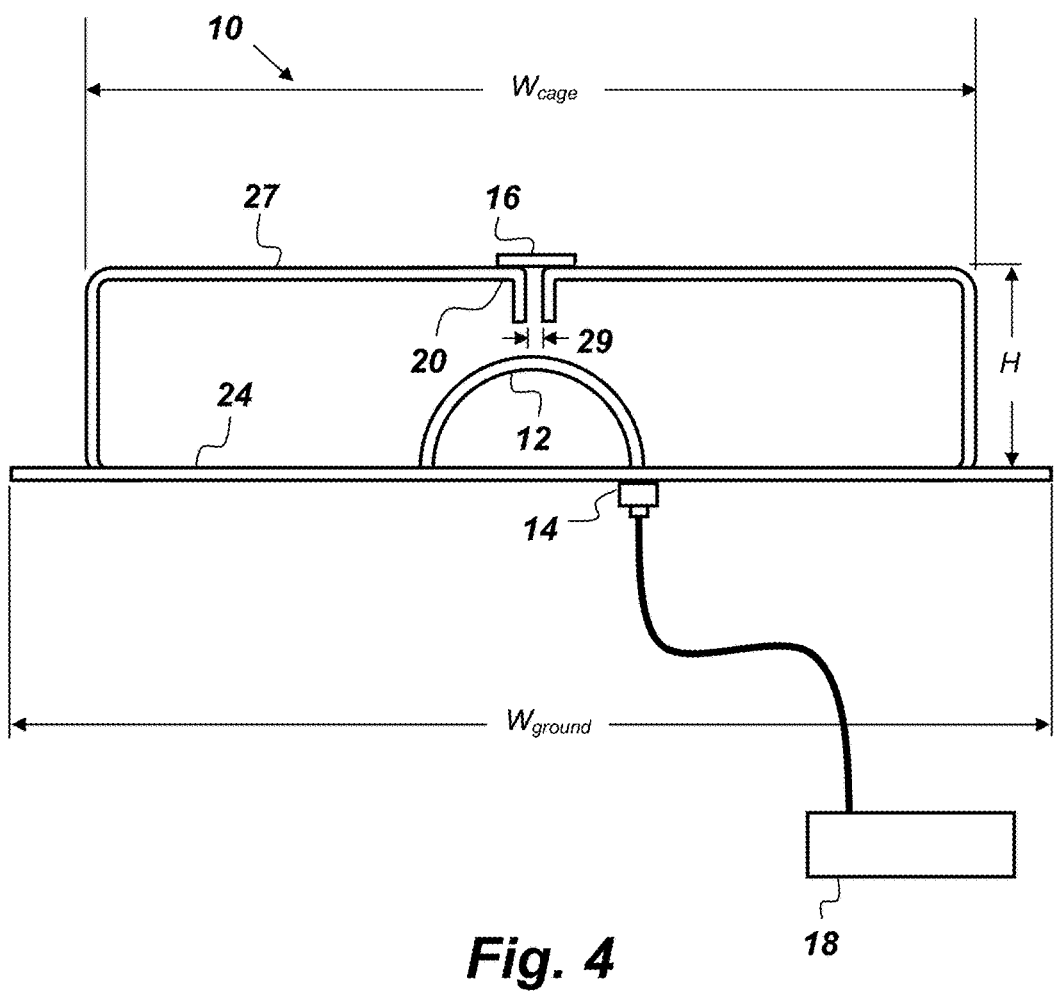
FIG. 4 is a side-view illustration of an embodiment of an electrically small antenna.

FIG. 4 is a side-view illustration of an embodiment of the ESA 10 comprising a cage 27 that is comprised of two separate halves separated from each other by a center gap 29. In this embodiment, the cage 27 is electrically connected to the 100 mm square ground plane 24. The non-Foster circuit 16 is disposed at the location 20, which, in this embodiment, is located at the center gap 29. In this embodiment, the height H of the cage 26 is 23 mm, the width $W_{cage}$ of the cage is 65 mm, and the length of the cage (not shown) is 65 mm. The gap 29 may optionally be filled with a dielectric spacer.

Figure 5:
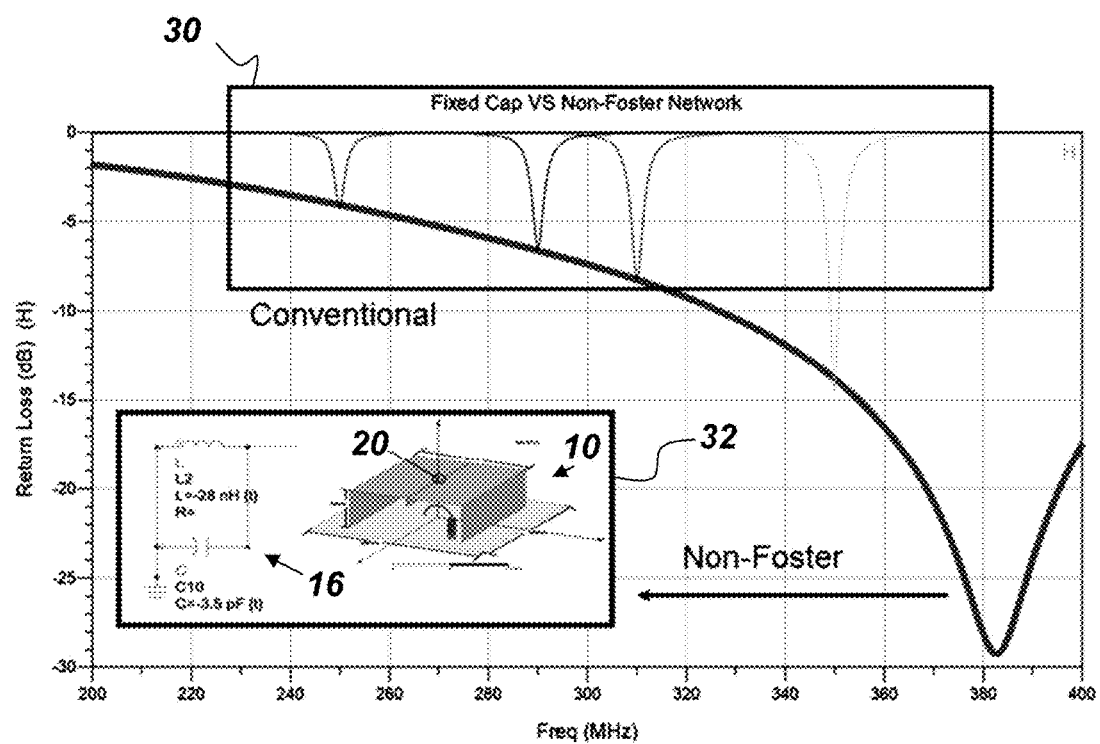
FIG. 5 is a plot of frequency versus return loss comparison of an antenna with and without integrated non-Foster circuitry.

FIG. 5 is a plot of frequency versus return loss for the ESA 10 shown in FIG. 4 and a traditional electrically small antenna having the same dimensions, but without the non-Foster circuit 16. In the embodiment of the ESA 10 used to obtain the data displayed in FIG. 5, the non-Foster circuit 16 comprised parallel L and C components with values of −26 nH and −3.5 pF respectively. The effect on the return loss of loading this embodiment of the ESA 10 with the active non-Foster circuit 16 is shown by the heavy black trace in FIG. 5. The return loss response of the passive matching, or conventional, antenna is outlined by rectangle 30. As can be seen in FIG. 5, the conventional antenna is well matched only at very narrow bandwidths. The insert 32 shows a perspective view of the embodiment of the ESA 10 shown in FIG. 4 as well as an embodiment of the non-Foster circuit 16, which is a tuned −LC tank circuit, which loads the ESA 10 uniquely in order to obtain a wideband response. The non-Foster circuit 16 does not load the ESA 10 at the input feed 14, but at the locations 20.

Figure 6:
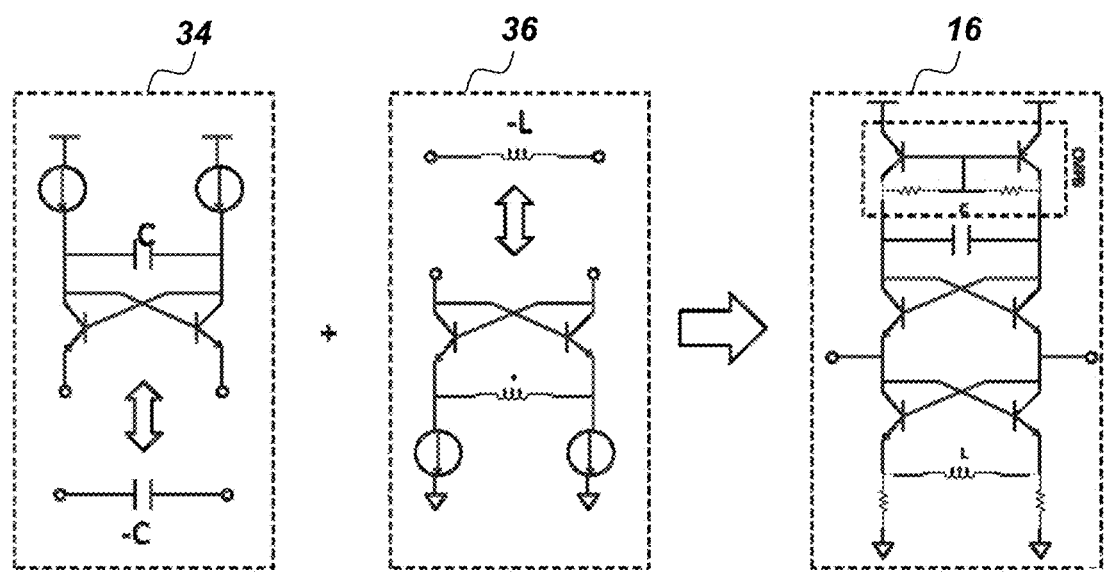
FIG. 6 is an illustration of a non-Foster –LC tank circuit topology.

FIG. 6 is an illustration of a −C circuit 34 combined with a −L circuit 36 to form a −LC tank circuit embodiment of the non-Foster circuit 16 having a negative impedance. FIG. 6 shows conceptually how a notional negative impedance LC tank circuit can be realized. It essentially consists of stacking an open circuit stable negative capacitor circuit 34 with a short circuit stable negative inductance circuit 36. The circuit may employ a common-mode feedback (CMFB) network to provide a stable DC operating point. In a linear circuit simulation environment, such as is provided by Agilent® ADS, we have verified this topology.

Figure 7A:
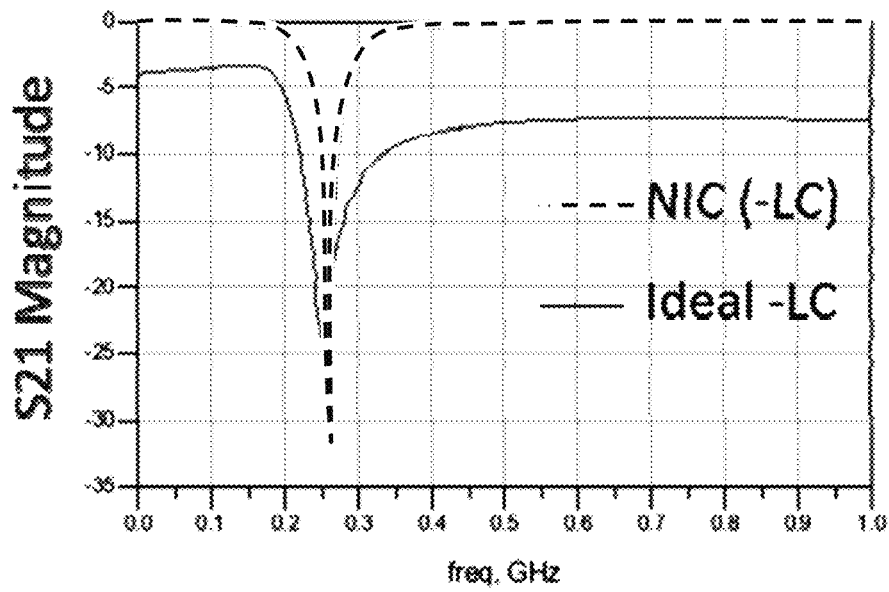
FIGS. 7A and 7B are plots showing simulated results using a negative impedance converter (NIC) network topology.
Figure 7B:
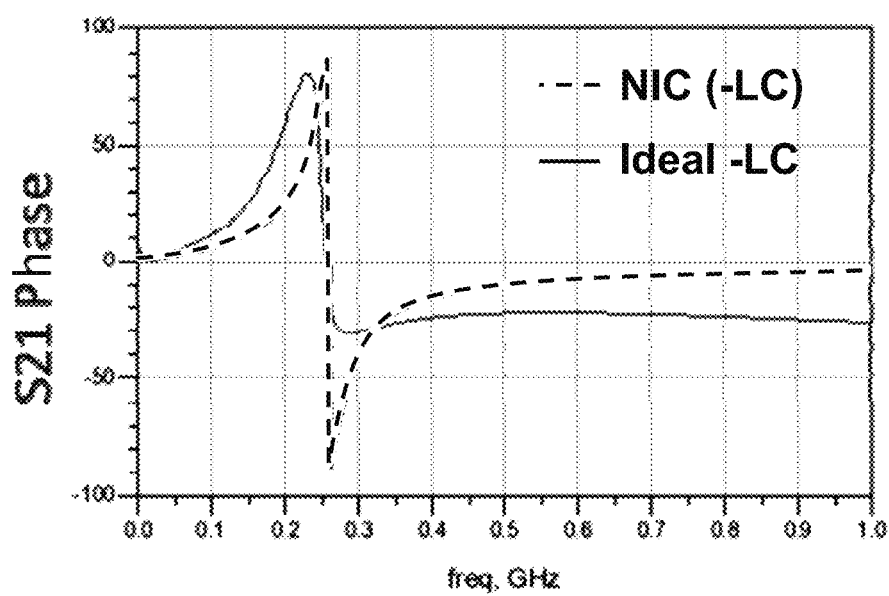

FIGS. 7A and 7B are plots showing simulated results using the embodiment of the non-Foster circuit 16 shown in FIG. 6, which may be described as a negative impedance converter (NIC). FIG. 7A shows the S21 Magnitude versus frequency results using the non-Foster circuit 16 shown in FIG. 6 to generate a −LC tank circuit (at 600 MHz) as compared to an ideal −LC tank circuit. FIG. 7B shows the S21 phase versus frequency for the −LC tank circuit (at 600 MHz) as compared to an ideal −LC tank circuit. As can be seen in FIG. 7B, the transmission phase is inverted for both the NIC −LC tank and the ideal −LC tank circuit, as compared to a +LC tank circuit.

An embodiment of the non-Foster circuit 16 may be derived from a transistor negative impedance converter, such as is described in J. G. Linvill's work "Transistor Negative-Impedance Converters" published in Proceedings of the IRE, 1953, Volume 41, Issue 6, pages 725-729. Such an embodiment of the non-Foster circuit 16 may be comprised of a cross-coupled transistor pair. The cross-coupled nature of the transistors generates effectively a negative current flow through the load of the transistors. The load could either be at the collectors of a bipolar junction transistor (BJT) or the emitters of the BJT, depending on whether the circuit needs to be open circuit stable (OCS) or short circuit stable (SCS). Field effect transistors may also be used. The negative capacitance circuit may be stacked with a negative inductance circuit, while adding a CMFB circuit to stabilize the DC operating conditions. Tuning of the negative capacitance may be attained through the use of a varactor (variable capacitor) at the load of the Linvill circuit. Tuning of the inductance is more difficult and would require the use of a negative inductance inverter, because variable inductors are not common.

Figure 8A:
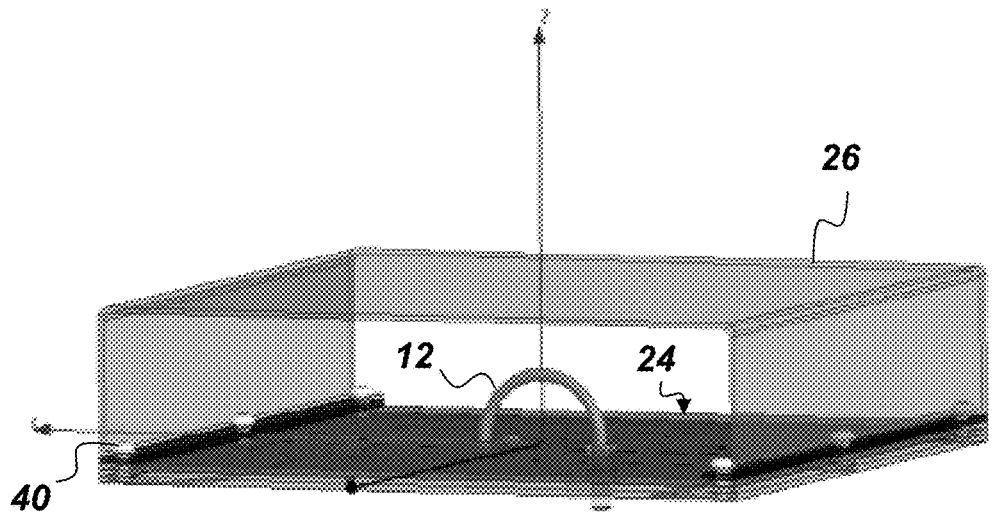
FIG. 8A is a perspective-view illustration of an embodiment of an electrically small antenna.

FIG. 8A is a perspective view of an embodiment of the ESA 10 that was described in a paper, which is incorporated herein by reference, by the inventors titled "UHF Electrically Small Box Cage Loop Antenna with an Embedded Non-Foster Load", which was printed in volume 13 of IEEE Antennas and Wireless Propagation Letters. The embodiment shown in FIG. 8A is a caged box loop antenna loaded with a non-Foster network that is electrically shielded from the antenna structure to enhance the radiated power bandwidth within the operation band of UHF frequencies (250-350 MHz). In the embodiment of the ESA 10 shown in FIG. 8A, the cage 26 is completely solid and the loading is done beneath the driven element 12.

Figure 8B:
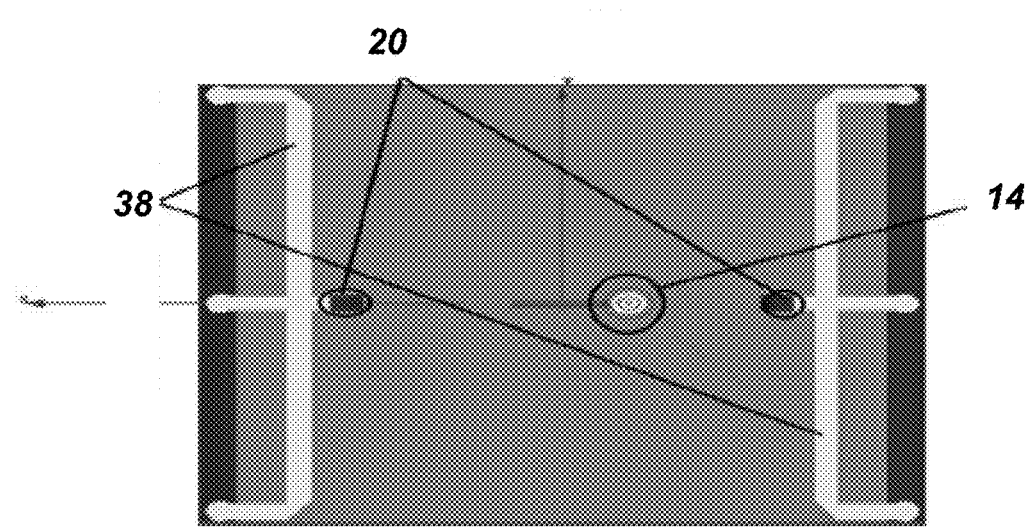
FIG. 8B is a bottom-view illustration of an embodiment of an electrically small antenna.

FIG. 8B is a bottom view of the ESA 10 shown in FIG. 8A. In FIG. 8B, one can see the input feed 14 and the locations 20. In this embodiment, the non-Foster circuit 16 comprises a microstrip feed network 38 placed on the bottom of the ESA 10 that is electrically connected to the cage 26 through brass bolts 40 (shown in FIG. 8A). The cage 26 and feeding network 38 are all electrically isolated from the ground plane 24 where the driven element 12 (in this case a half loop) is grounded. The non-Foster load is placed across the locations 20, or loading terminals.

Figure 9:
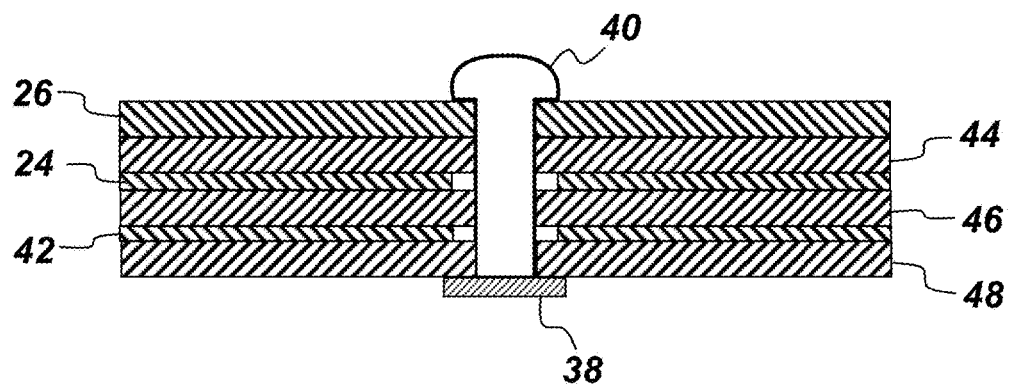
FIG. 9 is a cross-sectional view of a portion of an embodiment of an electrically small antenna.

FIG. 9 is a cross-sectional side view of a portion of the embodiment of the ESA 10 shown in FIGS. 8A and 8B. In this embodiment a lower ground plane 42 is introduced between the ground plane 24, which in this embodiment is referred to as the upper ground plane 24, and the mircostrip feed network 38 to further reduce the coupling of the microstrip feed network 38 and non-Foster trace currents from the upper ground plane 24. The cage 26 and the upper ground plane 24 are separated by a first dielectric layer 44. The upper and lower ground planes 24 and 42 are separated by a second dielectric layer 46. The feed network 38 and the lower ground plane 42 are separated by a third dielectric layer 48. A suitable example of the first, second, and third dielectric layers 44, 46, and 48 is a 62-mil-thick layer made of Rogers Duroid® 5880. The dimensions of this particular embodiment of the ESA 10 are listed in Table I.

TABLE 1

| | |
|---|---|
| Loop Antenna Radius (mm) | 8 |
| Metal Wire Radius (mm) | 0.785 |
| Ground Plane Area (mm²) | 7481.25 |
| Cage Height (mm) | 20.75 |
| Cage Depth (mm) | 85.5 |
| Cage Length (mm) | 87.5 |

TABLE 1-continued

Because this embodiment incorporates the non-Foster circuit 16 across the loading terminals, or locations 20, of the cage structure 26, the radiation mechanism of this design is similar to near-field resonant parasitic (NFRP) antenna types. However, this embodiment electrically shields the non-Foster circuit 16 from the driven element 12, reducing any electromagnetic interference (EMI) between the two. Furthermore, an EMI shield may be placed over the non-Foster circuit 16 without impacting performance of the ESA 10.

Figure 10:
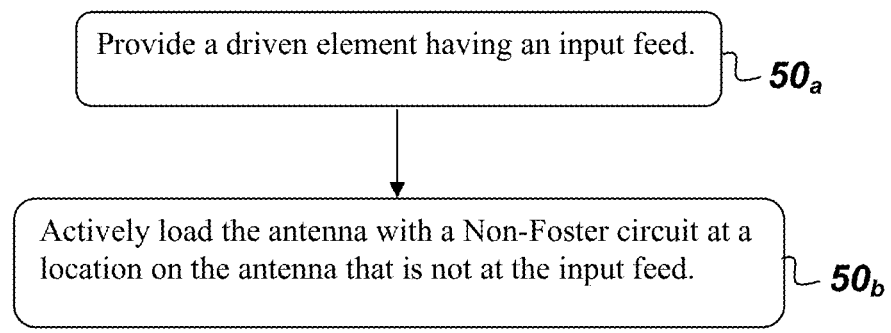
FIG. 10 is a flowchart of a method for providing an electrically small antenna.

FIG. 10 is a flowchart of a method 50 for providing the ESA 10 with a bandwidth beyond a Bode-Fano limit. The first step $50_a$ includes providing the driven element 12 having the input feed 14. The next step $50_b$ provides for actively loading the ESA 10 with the non-Foster circuit 16 at a location on the ESA 10 that is not at the input feed 14.

From the above description of the ESA 10, it is manifest that various techniques may be used for implementing the described concepts without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the ESA 10 is not limited to the particular embodiments described herein, but is capable of many embodiments without departing from the scope of the claims.

We claim:

1. An antenna comprising:
   a driven element;
   an input feed coupled to the driven element wherein the input feed is configured to be connected to a receiver;
   a conductive cage comprising three sides, wherein the conductive cage is positioned so as to encompass the driven element;
   a non-Foster circuit having a negative impedance, wherein the non-Foster circuit is configured to actively load the antenna at a location on the antenna other than at the input feed so as to achieve a bandwidth beyond a Bode-Fano limit; and
   a ground having first and second sides, wherein the conductive cage is mounted to the first side of the ground via dielectric mounts and wherein the non-Foster circuit loads the antenna at two locations on the second side of the ground that are opposite the dielectric mounts, and wherein the antenna is electrically small.

2. The antenna of claim 1, wherein the non-Foster circuit comprises a negative inductor in parallel with a negative capacitor.

3. An antenna comprising:
   a driven element;
   an input feed coupled to the driven element wherein the input feed is configured to be connected to a receiver;
   a conductive cage comprising three sides, wherein the conductive cage is positioned so as to encompass the driven element;
   a non-Foster circuit having a negative impedance, wherein the non-Foster circuit is configured to actively load the antenna at a location on the antenna other than at the input feed so as to achieve a bandwidth beyond a Bode-Fano limit; and a ground wherein two of the three sides of the conductive cage are in electrical contact with the ground and wherein the third side comprises two halves electrically separated by a center gap, and wherein the non-Foster circuit is mounted to both halves of the third side such that the non-Foster circuit spans the center gap, and wherein the antenna is electrically small.

4. The antenna of claim 2, wherein the negative inductor is set to a value of −26 nH and the negative capacitor is set to a value of −3.5 pF.

5. The antenna of claim 1, wherein the non-Foster circuit is a −LC tank circuit.

6. The antenna of claim 5, wherein the −LC tank circuit comprises an open-circuit, stable negative capacitor circuit stacked on a short-circuit stable negative inductance circuit.

7. The antenna of claim 1, wherein the non-Foster circuit employs a common-mode feedback (CMFB) network to provide a stable DC operating point.

8. The antenna of claim 1, wherein the non-Foster circuit is based on a cross-coupled transistor pair so as to generate negative current flow through a load of a cross-coupled pair of transistors.

9. The antenna of claim 1, wherein the non-Foster circuit comprises a negative capacitance circuit stacked on a negative inductance circuit that employs a common mode feedback (CMFB) circuit to stabilize direct current (DC) operating conditions.

10. A method for providing an electrically small antenna comprising the following steps:
 providing a driven element having an input feed;
 surrounding the driven element with a conductive cage;
 actively loading the antenna with a Non-Foster circuit at a location on the antenna that is not at the input feed to create an electrically small antenna with a bandwidth beyond a Bode-Fano limit;
 mounting the conductive cage to a ground, wherein the conductive cage comprises two halves, each half comprising first and second sides, wherein the first sides are mounted to the ground and the second sides of the two halves are separated from each other by a center gap; and
 mounting the non-Foster circuit to both halves such that the non-Foster circuit spans the center gap and actively loads the antenna at the center gap.

11. The method of claim 10, wherein the non-Foster circuit is a parallel −L −C circuit.

12. The method of claim 10, wherein the non-Foster circuit actively loads the antenna at the conductive cage.

13. The method of claim 11, wherein the −L portion of the circuit has a value of −26 nH and the −C portion of the circuit has a value of −3.5 pF.

14. The method of claim 10, wherein the non-Foster circuit is a −LC tank circuit.

15. The method of claim 14, wherein the step of actively loading the antenna further comprises stacking an open circuit stable negative capacitor circuit with a short circuit stable negative inductance circuit.

16. The method of claim 10, wherein the actively loading the antenna step further comprises the step of generating an effective negative current flow through a load of a cross-coupled pair of transistors.

17. The method of claim 15, further comprising the step of stabilizing direct current (DC) operating conditions with a common mode feedback (CMFB) circuit.

18. The method of claim 11 further comprising the step of tuning the negative capacitance with a varactor at a load of a Linvill circuit and tuning the negative inductance with a negative inductance inverter.

\* \* \* \* \*